United States Patent
Thijssen et al.

(10) Patent No.: US 10,291,214 B2
(45) Date of Patent: May 14, 2019

(54) FEEDFORWARD PHASE NOISE COMPENSATION

(71) Applicant: Analog Devices Global Unlimited Company, Hamilton (BM)

(72) Inventors: Bartholomeus Jacobus Thijssen, Enschede (NL); Eric Antonius Maria Klumperink, Lichtenvoorde (NL); Bram Nauta, Borne (NL); Philip Eugene Quinlan, Cork (IE)

(73) Assignee: Analog Devices Global Unlimited Company, Hamilton (BE)

( * ) Notice: Subject to any disclaimer, the term of this patent is extended or adjusted under 35 U.S.C. 154(b) by 0 days.

(21) Appl. No.: 15/906,160

(22) Filed: Feb. 27, 2018

(65) Prior Publication Data
US 2018/0254774 A1    Sep. 6, 2018

Related U.S. Application Data

(60) Provisional application No. 62/465,717, filed on Mar. 1, 2017.

(51) Int. Cl.
*H03K 5/1252* (2006.01)
*H03L 7/099* (2006.01)
(Continued)

(52) U.S. Cl.
CPC ............. *H03K 5/1252* (2013.01); *G06F 1/06* (2013.01); *H03L 7/0802* (2013.01); *H03L 7/093* (2013.01);
(Continued)

(58) Field of Classification Search
CPC ..... H03L 7/0802; H03L 7/093; H03L 7/0991; G06F 1/06; H03K 5/1252
(Continued)

(56) References Cited

U.S. PATENT DOCUMENTS

| 4,922,141 A | 5/1990 | Lofgren et al. |
| 5,043,596 A | 8/1991 | Masuda et al. |

(Continued)

FOREIGN PATENT DOCUMENTS

WO    WO 2010/016301    2/2010

OTHER PUBLICATIONS

International Search Report and Written Opinion of the International Searching Authority for International Application No. PCT/US2018/019963 dated Jun. 11, 2018, in 10 pages.
(Continued)

*Primary Examiner* — Thomas Skibinski
(74) *Attorney, Agent, or Firm* — Knobbe, Martens, Olson & Bear, LLP

(57) ABSTRACT

Clock systems with phase noise compensation are provided herein. In certain implementations, a clock system includes a phase noise detector for detecting a phase noise of a clock signal, and an adjustable delay circuit for generating an adjusted clock signal based on delaying the clock signal with a controllable delay. Additionally, the phase noise detector generates an error signal indicated the phase noise of the clock signal, and controls the delay of the adjustable delay circuit with the error signal over time to thereby compensate the clock signal for phase noise. Thus, the adjusted clock signal has reduced phase noise compared to the clock signal.

20 Claims, 7 Drawing Sheets

(51) Int. Cl.
*H03L 7/08* (2006.01)
*G06F 1/06* (2006.01)
*H03L 7/093* (2006.01)
*H03K 5/00* (2006.01)

(52) U.S. Cl.
CPC .. *H03L 7/0991* (2013.01); *H03K 2005/00019* (2013.01)

(58) Field of Classification Search
USPC .......... 327/147–163; 375/371–376; 331/1 R, 331/1 A; 341/155, 166
See application file for complete search history.

(56) References Cited

U.S. PATENT DOCUMENTS

| | | | |
|---|---|---|---|
| 5,101,117 | A | 3/1992 | Johnson et al. |
| 5,223,755 | A | 6/1993 | Richley |
| 5,629,651 | A | 5/1997 | Mizuno |
| 5,781,056 | A | 7/1998 | Fujii |
| 5,964,880 | A | 10/1999 | Liu et al. |
| 6,049,239 | A | 4/2000 | Eto et al. |
| 6,111,442 | A | 8/2000 | Aulet et al. |
| 6,157,690 | A | 12/2000 | Yoneda |
| 6,292,016 | B1 | 9/2001 | Jefferson et al. |
| 6,727,734 | B2 | 4/2004 | Gomm |
| 6,987,407 | B2 | 1/2006 | Chung et al. |
| 7,046,058 | B1 | 5/2006 | Fang et al. |
| 7,274,231 | B1 | 9/2007 | Gillespie et al. |
| 7,323,916 | B1 | 1/2008 | Sidiropoulos et al. |
| 7,368,961 | B2 | 5/2008 | Werner et al. |
| 7,737,743 | B1* | 6/2010 | Gao .................. H03L 7/087 327/156 |
| 7,907,016 | B2 | 3/2011 | Eikenbroek |
| 8,558,728 | B1* | 10/2013 | Lemkin ............ G01R 31/31709 341/166 |
| 9,160,518 | B1 | 10/2015 | Lin |
| 9,608,644 | B1 | 3/2017 | Raj et al. |
| 9,853,650 | B1 | 12/2017 | Kuan et al. |
| 2002/0079937 | A1 | 6/2002 | Xanthopoulos |
| 2005/0110544 | A1 | 5/2005 | Suda et al. |
| 2006/0164137 | A1 | 7/2006 | Van De Beek et al. |
| 2009/0163166 | A1 | 6/2009 | Lin |
| 2010/0237958 | A1 | 9/2010 | Goel et al. |
| 2013/0156076 | A1* | 6/2013 | Kinget ................... H04L 27/18 375/219 |

OTHER PUBLICATIONS

Abdelatty et al., "A VHF-UHF Multiphase Frequency Synthesizer for Wireless Transceivers" A Thesis Submitted to the Faculty of Engineering at Cairo University, Giza, Egypt 2015, in 124 pages.

Gao et al., "A Low Noise Sub-Sampling PLL in Which Divider Noise is Eliminated and PD/CP Noise is Not Multiplied by N2" IEEE Journal of Solid State Circuits, vol. 44, No. 12, Dec. 2009 (11 pages).

Gao et al., "Spur Reduction Techniques for Phase-Locked Loops Exploiting a Sub-Sampling Phase Dectector" IEEE Journal of Solid State Circuits, vol. 45, No. 9, Sep. 2010, in 13 pages.

Imani et al., "An FBAR/CMOS Frequency/Phase Discriminator and Phase Noise Reduction System" IEEE Transactions on Microwave Theory and Techniques, vol. 63, No. 5, May 2015 (8 pages).

Markulic et al., "A DTC-Based Subsampling PLL Capable of Self-Calibrated Fractional Synthesis and Two-Point Modulation" IEEE Journal of Solid-State Circuits, vol. 51, No. 12, Dec. 2016 (15 pages).

Min et al., "A 90-nm CMOS 5-GHz Ring-Oscillator PLL With Delay-Discriminator-Based Active Phase-Noise Cancellation" IEEE Journal of Solid-State Circuits, vol. 48, No. 5, May 2013 (10 pages).

Nagam et al., "A −236.3dB FoM Sub-Sampling Low-Jitter Supply-Robust Ring-Oscillator PLL for Clocking Applications with Feed-Forward Noise-Cancellation" Downloaded from ieeexplore.ieee.org/document/7993677/ on Feb. 9, 2018 (4 pages).

Nagam et al., "A Low-Jitter Ring-Oscillator Phase-Locked Loop Using Feedforward Noise Cancellation With a Sub-Sampling Phase Detector" IEEE Journal of Solid-State Circuits, Downloaded from ieeexplore.ieee.org/document/8271868/ on Feb. 9, 2018 (12 pages).

Thijssen et al. "Feedforward Phase Noise Cancellation Exploiting a Sub-Sampling Phase Detector" IEEE Transactions on Circuits and Systems II: Express Briefs, Oct. 18, 2017, in 5 pages.

* cited by examiner

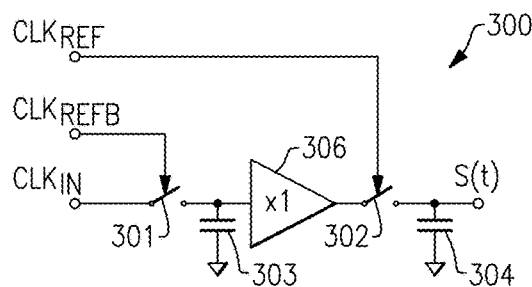
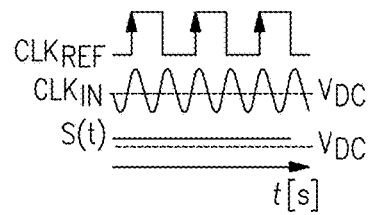
FIG.5A
FIG.5B
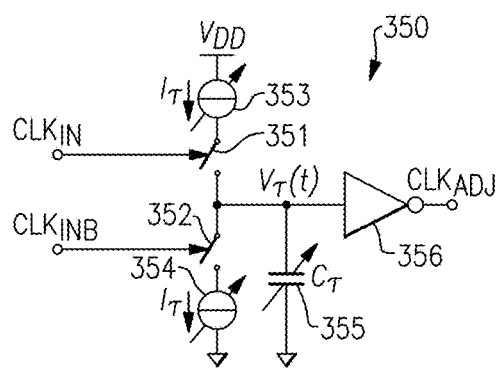
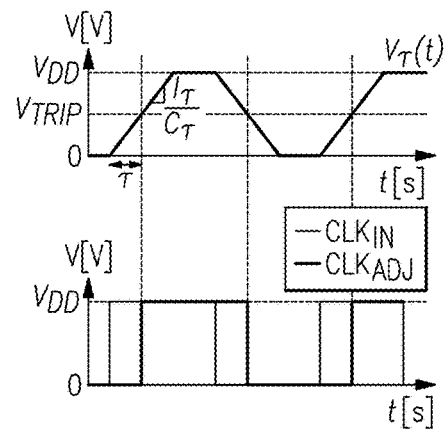
FIG.6A
FIG.6B

FEEDFORWARD PHASE NOISE COMPENSATION

CROSS-REFERENCE TO RELATED APPLICATIONS

The present application claims priority to U.S. Provisional Patent Application No. 62/465,717, filed Mar. 1, 2017, and titled "FEEDFORWARD PHASE NOISE CANCELLATION EMPLOYING A SUB-SAMPLING PHASE DETECTOR," the entirety of which is hereby incorporated herein by reference.

FIELD OF THE DISCLOSURE

Embodiments of the invention relate to electronic systems, and more particularly, to clock systems with phase noise compensation.

BACKGROUND

A wide variety of electronic systems operate based on timing of clock signals. For instance, examples of electronic circuitry that operate based on clock signal timing include, but are not limited to, analog-to-digital converters (ADCs), digital-to-analog converters (DACs), wireline or optical data communication links, and/or radio frequency front-ends.

SUMMARY OF THE DISCLOSURE

Clock systems with phase noise compensation are provided herein. In certain implementations, a clock system includes a phase noise detector for detecting a phase noise of a clock signal, and an adjustable delay circuit for generating an adjusted clock signal based on delaying the clock signal with a controllable delay. Additionally, the phase noise detector generates an error signal indicated the phase noise of the clock signal, and controls the delay of the adjustable delay circuit with the error signal over time to thereby compensate the clock signal for phase noise. Thus, the adjusted clock signal has reduced phase noise compared to the clock signal.

In one aspect, a clock system with phase noise compensation is provided. The clock system includes an adjustable delay circuit configured to receive an input clock signal and to generate an adjusted clock signal by delaying the input clock signal with a delay that is controllable. The clock system further includes a phase noise detector configured to generate an error signal indicating a phase noise of the input clock signal, and to control the delay of the adjustable delay circuit with the error signal over time to thereby compensate the input clock signal for phase noise.

In another aspect, an electronic system with phase noise compensation is provided. The electronic system includes a phase-locked loop (PLL) configured to generate a PLL output clock signal based on timing of a reference clock signal, an adjustable delay circuit configured to generate an adjusted clock signal by delaying the PLL output clock signal with a delay that is controllable, and a phase noise detector configured to generate an error signal indicating a phase noise of the PLL output clock signal, and to control the delay of the adjustable delay circuit with the error signal to compensate the PLL output clock signal for phase noise.

In another aspect, a method of phase noise compensation is provided. The method includes detecting a phase noise of an input clock signal based on samples captured by a reference clock signal having a controlled timing relationship with respect to the input clock signal, generating an error signal based on the detected phase noise, generating an adjusted clock signal by delaying the input clock signal using an adjustable delay circuit, and controlling a delay of the adjustable delay circuit with the error signal to thereby compensate the input clock signal for phase noise.

BRIEF DESCRIPTION OF THE DRAWINGS

FIG. 5A is a schematic diagram of one embodiment of a sub-sampling phase detector (SSPD).

FIG. 5B is one example of a timing diagram for the SSPD of FIG. 5A.

FIG. 6A is a schematic diagram of one embodiment of an adjustable delay circuit.

FIG. 6B is one example of a timing diagram for the adjustable delay circuit of FIG. 6A.

DETAILED DESCRIPTION OF EMBODIMENTS

Figure 1:
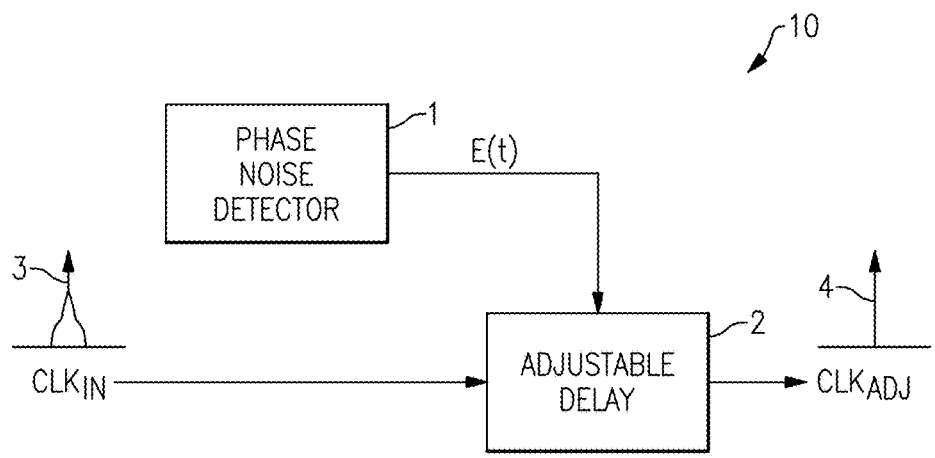
FIG. 1 is a schematic diagram of one embodiment of a clock system with phase noise compensation.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The performance of electronic systems that operate based on timing of clock signals is impacted by the accuracy and/or precision of the clock signals used to control timing. Thus, reducing or eliminating phase noise of the clock signals can improve the performance of such electronic systems. Moreover, a reduction in phase noise can provide additional benefits, such as enhanced design flexibility and/or lower design cost.

A semiconductor die or chip can include a phase-locked loop (PLL) used to generate an output clock signal based on an input reference clock signal. For example, a division value of a frequency divider in a feedback loop of the PLL can be selected to control the PLL's output frequency.

A PLL is long term stable, but the performance of the PLL is limited by loop stability. For example, a PLL using a phase-frequency detector (PFD) can operate with a loop bandwidth of up to about ten percent of the PLL's input reference frequency. Certain PLL architectures, such as sub-sampling PLLs (SSPLLs) can offer superior phase noise performance relative to PFD-based PLLs. However, SSPLLs can nevertheless suffer from bandwidth limitations. PLLs can also exhibit an undesirable trade-off between phase noise/jitter and power consumption, and can suffer from performance limitations arising from spurs.

Clock systems with phase noise compensation are provided herein. In certain implementations, a clock system includes a phase noise detector for detecting a phase noise of a clock signal, and an adjustable delay circuit for generating an adjusted clock signal based on delaying the clock signal with a controllable delay. Additionally, the phase noise detector generates an error signal indicated the phase noise of the clock signal, and controls the delay of the adjustable delay circuit with the error signal over time to thereby compensate the clock signal for phase noise. Thus, the adjusted clock signal has reduced phase noise compared to the clock signal.

In certain configurations, the error signal is generated based on samples captured by a reference clock signal having a controlled timing relationship with respect to the input clock signal. In one example, the reference clock signal controls a sampling circuit (for instance, a sub-sampling phase detector or SSPD) to generate a sampled signal that is processed to generate the error signal. For instance, the sampled signal can be generated by collecting the samples from the clock signal itself or another clock signal (for instance, a feedback clock signal of a PLL) having similar timing information as the clock signal. In another example, the error signal is generated based on processing a suitable signal taken from a loop of a PLL, such as an output of an SSPD, time-to-digital converter (TDC), and/or other suitable PLL component(s).

The phase noise compensation operates to generate the adjusted clock signal with reduced phase noise compared to the clock signal. Moreover, in implementations in which phase noise compensation is provide to an output clock signal from a PLL, the phase noise compensation can serve to reduce or eliminate spurs, including, for example, spurs associated with a controllable oscillator of the PLL and/or spurs associated with an input reference to the PLL.

The adjusted clock signal in turn can be used to control timing of a wide variety of electronic systems, including, but not limited to, analog-to-digital converters (ADCs), digital-to-analog converters (DACs), wireline or optical data communication links, and/or radio frequency front-ends. Since the adjusted clock signal has low phase noise, operation of such electronic systems is enhanced and/or the electronic systems can be implemented with enhanced flexibility and/or lower cost.

Furthermore, the clock systems herein overcome limitations associated with certain traditional design tradeoffs. In a first example, a tradeoff between bandwidth and phase noise can be overcome since the phase noise compensation already provides low phase noise. In a second example, a tradeoff between power consumption and jitter can be overcome because jitter is improved by providing phase noise compensation.

FIG. 1 is a schematic diagram of one embodiment of a clock system 10 with phase noise compensation. The clock system 10 receives an input clock signal $CLK_{IN}$ and generates an adjusted clock signal $CLK_{ADJ}$ with lower phase noise relative to the input clock signal $CLK_{IN}$. As shown in FIG. 1, the clock system 10 includes a phase noise detector 1 and an adjustable delay circuit 2.

With continuing reference to FIG. 1, the phase noise detector 1 generates an error signal E(t) indicating a phase noise of the input clock signal $CLK_{IN}$. As will be described in further detail below, the phase noise detector 1 can generate the error signal E(t) in a wide variety of ways, including, for example, by measuring or observing the phase noise directly or indirectly from the input clock signal $CLK_{IN}$.

In certain implementations, the error signal E(t) is generated by detecting phase noise of the input clock signal $CLK_{IN}$ based on sampling the input clock signal $CLK_{IN}$ with a reference clock signal having a controlled timing relationship (for instance, a synchronized timing relationship) with respect to the input clock signal $CLK_{IN}$.

As shown in FIG. 1, the adjustable delay circuit 2 generates the adjusted clock signal $CLK_{ADJ}$ based on the input clock signal $CLK_{IN}$ and the error signal E(t). The adjustable delay circuit 2 generates the adjusted clock signal $CLK_{ADJ}$ based on delaying the input clock signal $CLK_{IN}$ with an amount of delay that changes based on a value of the error signal E(t). Thus, in response to the error signal E(t), the adjustable delay circuit 2 varies the delay of the input clock signal $CLK_{IN}$ over time to reduce or eliminate phase noise.

The error signal E(t) is time-varying, and indicates an instantaneous phase error of the input clock signal $CLK_{IN}$. Additionally, changing the delay of the adjustable delay circuit 2 based on the error signal E(t) operates to subtract the phase noise from the input clock signal $CLK_{IN}$ to thereby generate the adjusted clock signal $CLK_{ADJ}$ with higher spectral purity.

Thus, the adjusted clock signal $CLK_{ADJ}$ has reduced phase noise compared to the input clock signal $CLK_{IN}$. For example, FIG. 1 has been annotated to show an example magnitude versus frequency plot 3 for the input clock signal $CLK_{IN}$ and an example magnitude versus frequency plot 4 for the adjusted clock signal $CLK_{ADJ}$. As shown by a comparison of the magnitude versus frequency plots, the clock system 10 provides phase noise compensation that improves the phase noise profile of a clock signal by enhancing spectral purity and reducing phase perturbations or jitter.

Figure 2A:
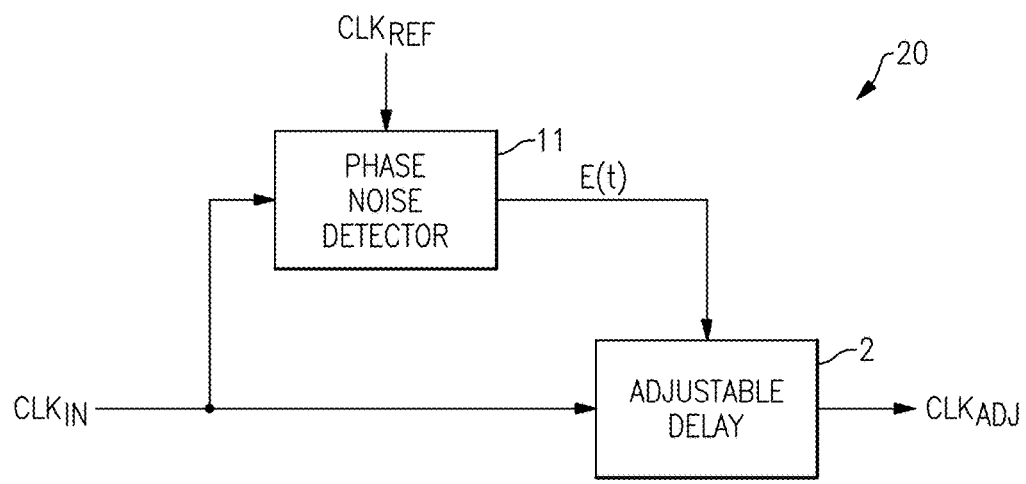
FIG. 2A is a schematic diagram of another embodiment of a clock system with phase noise compensation.

FIG. 2A is a schematic diagram of another embodiment of a clock system 20 with phase noise compensation. The clock system 20 includes a phase noise detector 11 and an adjustable delay circuit 2.

As shown in FIG. 2A, the adjustable delay circuit 2 receives the input clock signal $CLK_{IN}$ and generates an adjusted clock signal $CLK_{ADJ}$ by changing a delay provided to the input clock signal $CLK_{IN}$ based on the error signal E(t). The adjustable delay circuit 2 can include any suitable controllable delay element or combination of controllable delay elements. The error signal E(t) can provide analog and/or digital control of the delay of the adjustable delay circuit 2.

In the illustrated embodiment, the phase noise detector 11 generates the error signal E(t) by detecting phase noise based on comparing timing of the input clock signal $CLK_{IN}$ to timing of a reference clock signal $CLK_{REF}$.

With continuing reference to FIG. 2A, the reference clock signal $CLK_{REF}$ has a controlled timing relationship with respect to the input clock signal $CLK_{IN}$. For example, the reference clock signal $CLK_{REF}$ can have a controlled frequency and phase relationship compared to the input clock signal $CLK_{IN}$ such that the reference clock signal $CLK_{REF}$ is aligned to the input clock signal $CLK_{IN}$ at certain time instances.

In certain implementations, the reference clock signal $CLK_{REF}$ and the input clock signal $CLK_{IN}$ have an average phase difference of about zero, and a frequency of the reference clock signal $CLK_{REF}$ is related to a frequency of the input clock signal $CLK_{IN}$ by an integer multiple. The frequency of the reference clock signal $CLK_{REF}$ can be greater than, less than, or equal to the frequency of input clock signal $CLK_{IN}$, depending on implementation.

Figure 2B:
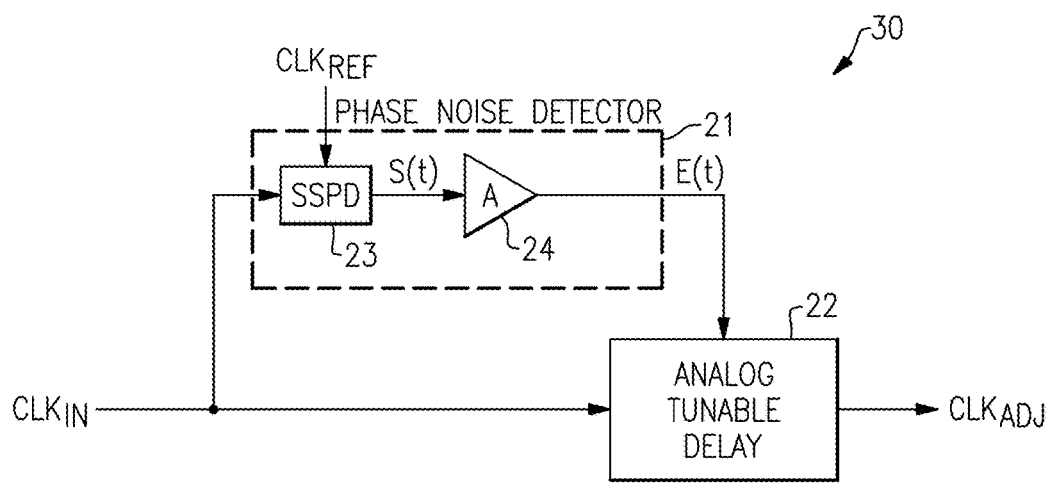
FIG. 2B is a schematic diagram of another embodiment of a clock system with phase noise compensation.

FIG. 2B is a schematic diagram of another embodiment of a clock system 30 with phase noise compensation. The clock system 30 includes a phase noise detector 21 and an analog tunable delay circuit 22.

The clock system 30 of FIG. 2B is similar to the clock system 20 of FIG. 2A, except that the clock system 30 of FIG. 2B illustrates specific configurations of the phase noise detector and adjustable delay circuit.

In particular, the phase noise detector 21 of FIG. 2B includes a sub-sampling phase detector (SSPD) 23 and an amplifier 24. The SSPD 23 generates a sampled signal S(t) based on sampling the input clock signal $CLK_{IN}$ based on timing of the reference clock signal $CLK_{REF}$. Additionally, the amplifier 24 generates the error signal E(t) based on amplifying the sampled signal S(t). Furthermore, the amplifier 24 controls a delay of the analog tunable delay circuit 22 with the error signal E(t) to thereby compensate the input clock signal $CLK_{IN}$ for phase noise.

In certain implementations, a gain of the amplifier 24 is configured to compensate for a detection gain $K_{SSPD}$ of the SSPD 23 and a voltage to delay sensitivity $K_\tau$ of the analog tunable delay circuit 22. In one embodiment, the gain of the amplifier 24 is about equal to $1/(K_{SSPD}*K_\tau)$. In certain implementations, the gain of the amplifier 24 is calibrated to aid in providing suitable gain for achieving phase noise compensation.

Figure 2C:
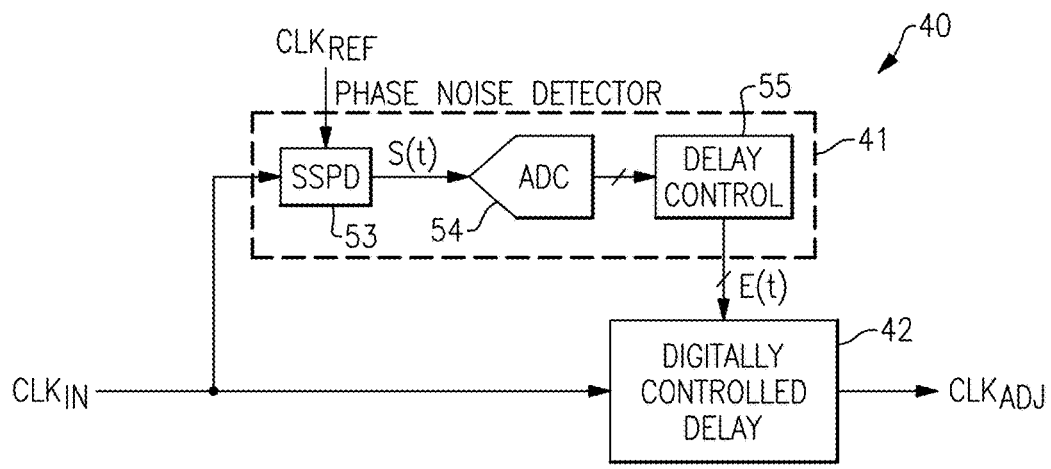
FIG. 2C is a schematic diagram of another embodiment of a clock system with phase noise compensation.

FIG. 2C is a schematic diagram of another embodiment of a clock system 40 with phase noise compensation. The clock system 40 includes a phase noise detector 41 and a digitally controlled delay circuit 42.

The clock system 40 of FIG. 2C is similar to the clock system 20 of FIG. 2A, except that the clock system 40 of FIG. 2C illustrates specific configurations of the phase noise detector and adjustable delay circuit.

In particular, the phase noise detector 41 of FIG. 2C includes an SSPD 53 that generates a sampled signal S(t) based on sampling the input clock signal $CLK_{IN}$ based on timing of the reference clock signal $CLK_{REF}$. Additionally, the phase noise detector 41 further includes an analog-to-digital converter (ADC) 54 that quantizes the sampled signal S(t), and a delay control circuit 41 that processes the quantized signal to generate an error signal E(t) for providing delay control to the digitally controlled delay circuit 42.

Thus, the error signal E(t) is a multi-bit digital error signal, in this embodiment. In certain implementations, the delay control circuit 41 is calibrated to aid in controlling the error signal E(t) with values suitable to achieve phase noise compensation.

Figure 3A:
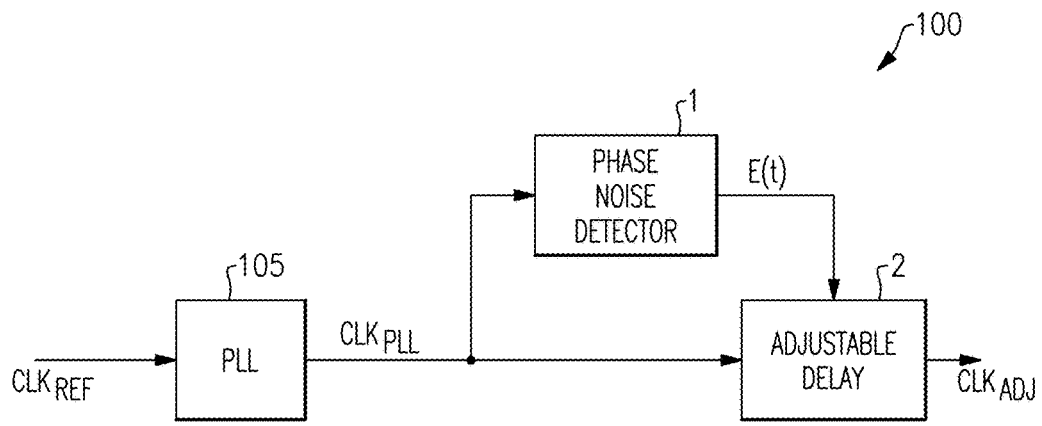
FIG. 3A is a schematic diagram of another embodiment of a clock system with phase noise compensation.

FIG. 3A is a schematic diagram of another embodiment of a clock system 100 with phase noise compensation. The clock system 100 includes a phase noise detector 1, an adjustable delay circuit 2, and a PLL 105.

The clock system 100 of FIG. 3A is similar to the clock system 10 of FIG. 1, except that the clock system 100 of FIG. 3A further includes the PLL 105 for generating a PLL clock signal $CLK_{PLL}$ that serves as the input clock signal to the phase noise detector 1 and the adjustable delay circuit 2. As shown in FIG. 3A, the PLL 105 generates the PLL clock signal $CLK_{PLL}$ based on timing of a reference clock signal $CLK_{REF}$.

In certain implementations herein, an adjustable delay circuit is included in cascade with a PLL to thereby compensate the PLL's output clock signal for phase noise. The compensation provided by the adjustable delay circuit can generate an adjusted clock signal with lower phase noise and jitter relative to that of the PLL's output clock signal.

Furthermore, the phase noise reduction bandwidth is not limited by the PLL's loop bandwidth, but rather by the detection bandwidth of the phase noise detector 1, which can approach or equal the Nyquist limit. Moreover, the spurs of the PLL's output clock signal can be reduced or eliminated as well, and thus the adjusted clock signal can also have smaller spurs relative to the PLL's output clock signal.

Figure 3B:
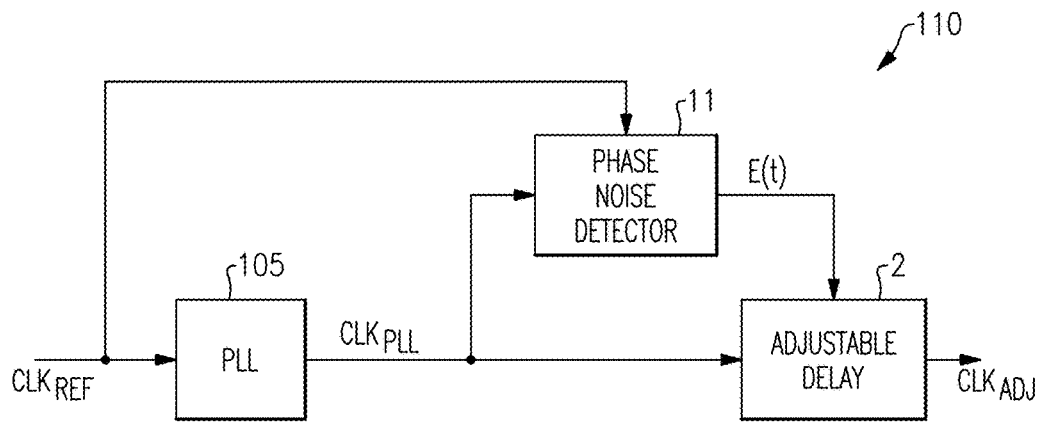
FIG. 3B is a schematic diagram of another embodiment of a clock system with phase noise compensation.

FIG. 3B is a schematic diagram of another embodiment of a clock system 110 with phase noise compensation. The clock system 110 includes a phase noise detector 11, an adjustable delay circuit 2, and a PLL 105.

The clock system 110 of FIG. 3B is similar to the clock system 100 of FIG. 3A, except that the clock system 110 of FIG. 3B includes the phase noise detector 11 for generating the error signal E(t) based on timing of the reference clock signal $CLK_{REF}$. Thus, timing of the reference clock signal $CLK_{REF}$ is used both as an input reference to the PLL 105 and as a reference for detecting phase noise in the phase noise detector 11.

Figure 3C:
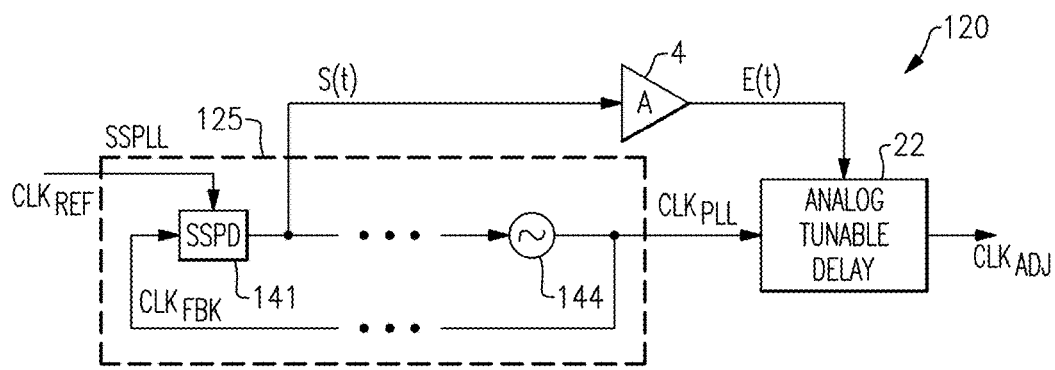
FIG. 3C is a schematic diagram of another embodiment of a clock system with phase noise compensation.

FIG. 3C is a schematic diagram of another embodiment of a clock system 120 with phase noise compensation. The clock system 120 includes an amplifier 4, an analog tunable delay circuit 22, and a sub-sampling phase-locked loop (SSPLL) 125.

The SSPLL 125 includes a feedback loop including an SSPD 141 and a controllable oscillator 144 (for instance, a voltage controlled oscillator or VCO) operating therein. As shown in FIG. 3C, the SSPD 141 generates a sampled signal S(t) by sampling a feedback clock signal $CLK_{FBK}$ of the SSPLL 125 based on timing of the reference clock signal $CLK_{REF}$. The sampled signal S(t) is used to achieve phase acquisition in the SSPLL 125. Additionally, the amplifier 4 amplifies the sampled signal S(t) to generate an error signal E(t) for controlling a delay provided by the analog tunable delay circuit 22.

The clock system 120 of FIG. 3C includes phase noise compensation similar to that of the clock system 40 of FIG. 2C, except that the clock system 120 of FIG. 3C includes an SSPD not only for providing phase noise detection, but also that operates in a loop of an SSPLL.

By using the SSPD 141 for multiple functions, an overall size, cost, and/or component count of the clock system 120 is reduced relative to an implementations using separate SSPDs for PLL phase acquisition and for phase noise detection.

Figure 3D:
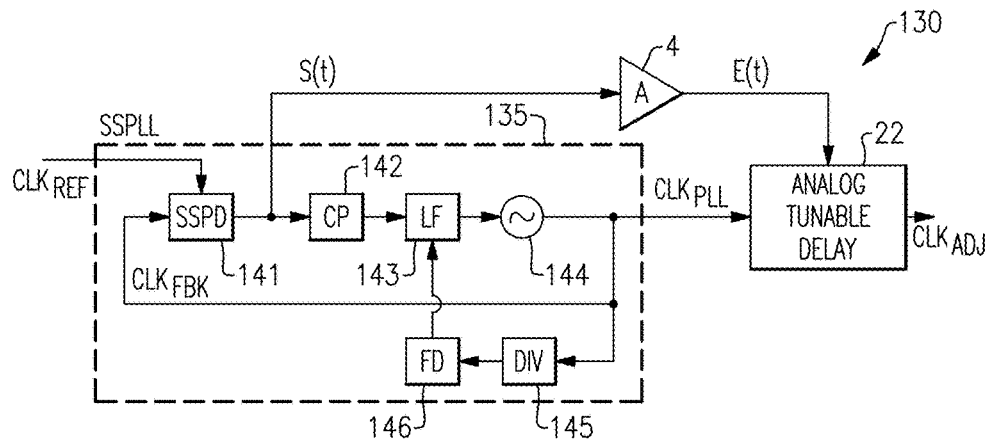
FIG. 3D is a schematic diagram of another embodiment of a clock system with phase noise compensation.

FIG. 3D is a schematic diagram of another embodiment of a clock system 130 with phase noise compensation. The clock system 130 includes an amplifier 4, an analog tunable delay circuit 22, and an SSPLL 135. The clock system 130 of FIG. 3D is similar to the clock system 120 of FIG. 3C, except that the clock system 130 of FIG. 3D includes a specific implementation of an SSPLL.

In particular, the SSPLL 135 of FIG. 3D includes an SSPD 141, a charge pump 142, a loop filter 143, and a controllable oscillator 144, which are connected in a phase locking loop. The SSPLL 135 further includes a divider 145 and a frequency detector 146 which operate with the loop filter 143 and the controllable oscillator 144 in a frequency locking loop. The SSPLL 135 operates in an initial frequency acquisition mode in which the frequency locking loop achieves frequency lock, and a subsequent phase acquisition mode in which the phase locking loop achieves phase lock.

Figure 3E:
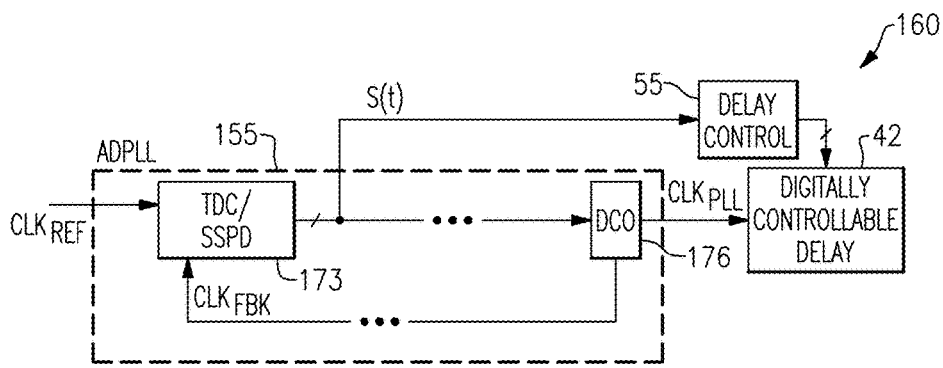
FIG. 3E is a schematic diagram of another embodiment of a clock system with phase noise compensation.

FIG. 3E is a schematic diagram of another embodiment of a clock system 160 with phase noise compensation. The clock system 160 includes a digitally controllable delay circuit 42, a delay control circuit 55, and an all-digital phase-locked loop (ADPLL) 155.

The ADPLL 155 includes a feedback loop including a time-to-digital converter (TDC)/SSPD 173 and a digitally controlled oscillator 176. The TDC/SSPD 173 can include a TDC and/or SSPD (for instance, an analog SSPD and an ADC for digitizing the output of the SSPD) for detecting a phase error between the reference clock signal $CLK_{REF}$ and the feedback clock signal $CLK_{FBK}$. In certain implementations, a TDC is assisted by an SSPD to provide time-to-digital conversion with enhanced accuracy. For instance, the TDC and SSPD can operate to generate coarse and fine representations of the phase error.

As shown in FIG. 3E, the TDC/SSPD 173 generates a digital sampled signal S(t) based on a digital representation of the time difference between an edge of the reference clock signal $CLK_{REF}$ and an edge of the feedback clock signal $CLK_{FBK}$. Additionally, the delay control circuit 55 digitally processes the sampled signal S(t) to generate an error signal E(t) for controlling a delay provided by the digitally controllable delay circuit 42 over time.

The clock system 160 of FIG. 3E illustrates one example of phase noise compensation in which circuitry for detecting phase noise is shared with circuitry that operates in a feedback loop of an ADPLL. By sharing circuitry in this manner, an overall size, cost, and/or component count of the clock system 160 is reduced.

The phase noise compensation systems herein can share circuitry with a PLL, including but not limited to, an SSPLL or an ADPLL.

Figure 3F:
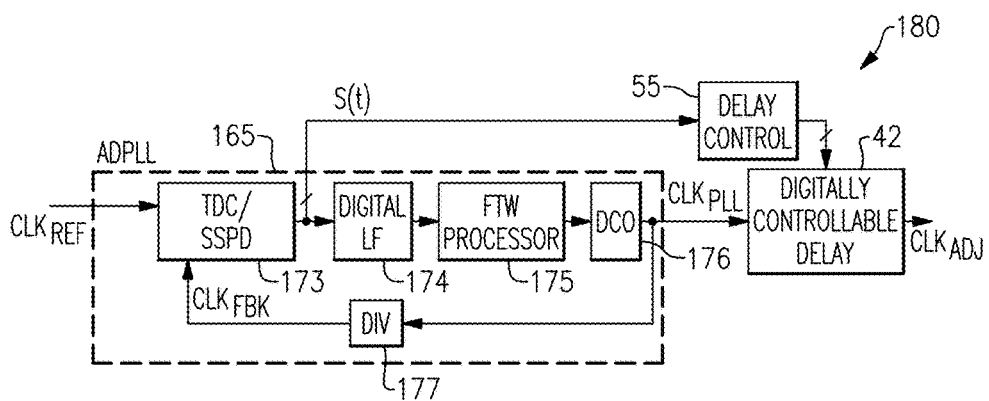
FIG. 3F is a schematic diagram of another embodiment of a clock system with phase noise compensation.

FIG. 3F is a schematic diagram of another embodiment of a clock system 180 with phase noise compensation. The clock system 180 includes a digitally controllable delay circuit 42, a delay control circuit 55, and an ADPLL 165. The clock system 180 of FIG. 3F is similar to the clock system 160 of FIG. 3E, except that the clock system 180 of FIG. 3F includes a specific implementation of an ADPLL.

In particular, the ADPLL 165 of FIG. 3F includes an TDC/SSPD 173, a digital loop filter 174, a frequency tuning word processor 175, a DCO 176, and a feedback divider 177 connected in a feedback loop.

Although various example of PLLs with phase compensation have been shown, the teachings herein are applicable to PLLs and/or phase compensation circuity implemented in a wide variety of ways.

Figure 4A:
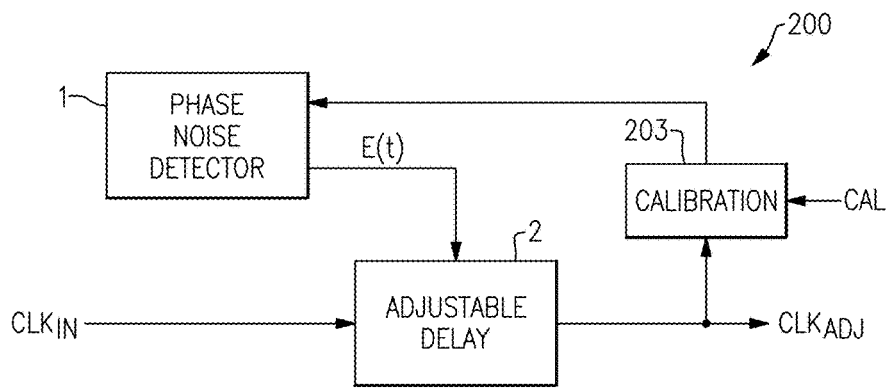
FIG. 4A is a schematic diagram of one embodiment of a clock system with calibrated phase noise compensation.

FIG. 4A is a schematic diagram of one embodiment of a clock system 200 with calibrated phase noise compensation. The clock system 200 includes a phase noise detector 1, an adjustable delay circuit 2, and a calibration circuit 203.

The clock system 200 of FIG. 4A is similar to the clock system 10 of FIG. 1, except that the clock system 200 of FIG. 4A further includes the calibration circuit 203, which operates to calibrate the phase noise detector 1 such that the error signal E(t) controls the adjustable delay circuit 2 with a proper amount of delay adjustment for a given amount of detected phase noise.

For example, the adjustable delay circuit 2 can have a delay sensitivity associated with a change of delay in response to a given change in the error signal E(t). By including the calibration circuit 203, the phase noise detector 1 generates the error signal E(t) with appropriate analog or digital amplitude for compensating for detected phase noise.

In certain implementations, the calibration circuit 203 receives a calibration signal CAL for selectively initiating a calibration cycle. Using the calibration signal CAL can reduce power consumption by operating the calibration circuit 203 during calibration cycles, for instance, at start-up and/or as desired during run-time. However, the teachings herein are also applicable to background calibration schemes in which the calibration circuit 203 provides continuous or quasi-continuous feedback for calibration.

Although various example implementations of the calibration circuit 203 are described below, the calibration circuit 203 can be implemented in a wide variety of ways. Furthermore, although calibration is illustrated and described in the context of FIGS. 4A-4C, any of the phase noise compensation systems herein can be implemented with calibration.

Figure 4B:
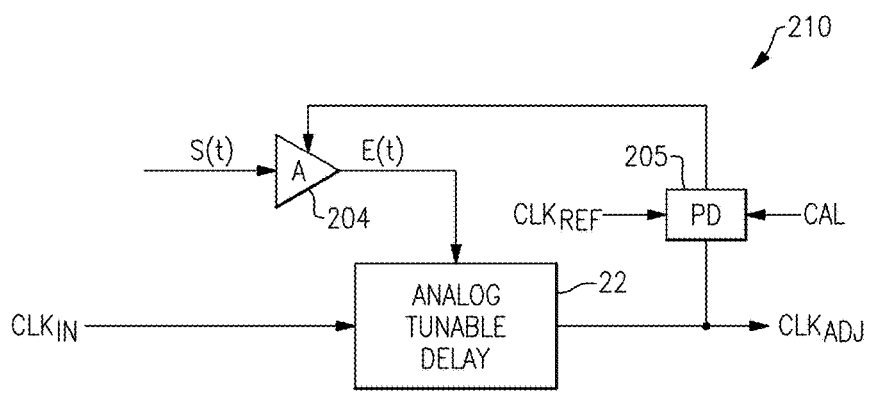
FIG. 4B is a schematic diagram of another embodiment of a clock system with calibrated phase noise compensation.

FIG. 4B is a schematic diagram of another embodiment of a clock system 210 with calibrated phase noise compensation. The clock system 210 includes an analog tunable delay circuit 22, an amplifier 204, and a phase detector 205.

The amplifier 204 amplifies a sampled signal S(t) to generate an error signal E(t). Additionally, the amplifier 204 has a gain which is calibrated by the phase detector 205. In particular, the phase detector 205 compares the phase of the adjusted clock signal $CLK_{ADJ}$ to the phase of reference clock signal $CLK_{REF}$ in response to activation of the calibration signal CAL, and controls the amplifier's gain based on the result of the comparison. In particular, the phase detector 205 controls the gain of the amplifier 204 to reduce or eliminate phase error of the adjusted clock signal $CLK_{ADJ}$ relative to the reference clock signal $CLK_{REF}$.

The phase detector 205 can be implemented in a wide variety of ways including, but not limited to, using an exclusive or (XOR) gate, a phase-frequency detector (PFD), and/or any other suitable detector for detecting a phase error between the adjusted clock signal $CLK_{ADJ}$ and the reference clock signal $CLK_{REF}$.

Figure 4C:
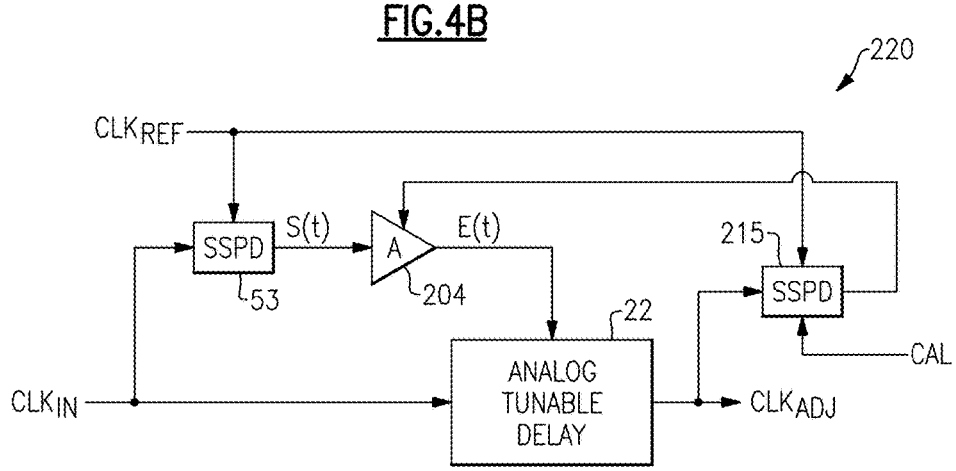
FIG. 4C is a schematic diagram of another embodiment of a clock system with calibrated phase noise compensation.

FIG. 4C is a schematic diagram of another embodiment of a clock system 220 with calibrated phase noise compensation. The clock system 220 includes an analog tunable delay circuit 22, and a phase noise detector that includes a first SSPD 53 and an amplifier 204. Additionally, the clock system 220 includes a second SSPD 215, which operates to calibrate the gain of the amplifier 204 based on comparing the adjusted clock signal $CLK_{ADJ}$ to the reference clock signal $CLK_{REF}$ in response to activation of the calibration signal CAL.

FIG. 5A is a schematic diagram of one embodiment of an SSPD 300. The SSPD 300 includes an input switch 301, an output switch 302, a sampling capacitor 303, a hold capacitor 304, and a buffer 306, which is unity gain in this implementation.

As shown in FIG. 5A, the input clock signal $CLK_{IN}$ is sampled on the sampling capacitor 303 in response to a falling edge (rising edge in an another implementation) of the inverted reference clock signal $CLK_{REFB}$. Additionally, in response to a rising edge (falling edge in an another implementation) of the reference clock signal $CLK_{REF}$, the unity gain buffer 306 controls the voltage across the hold capacitor 304 to be about equal to the voltage across the sampling capacitor 303. The inverted reference clock signal $CLK_{REFB}$ can be generated in a wide variety of ways, such as using an inverter circuit to invert the reference clock signal $CLK_{REF}$, or can be readily available in a differential implementation.

The switches and capacitors provide a sample and hold operation with respect to the input clock signal $CLK_{IN}$.

Including the unity gain buffer 306 operates to prevent the SSPD from reducing phase noise reduction bandwidth when the SSPD is incorporated into a PLL loop. Inclusion of the unity gain buffer 306 avoids charge sharing of the sampling capacitor 303 and the hold capacitor 304 and thus avoids reduction in phase noise detection bandwidth. Accordingly, presence of the unity gain buffer 306 provides desirable frequency domain characteristics to prevent a substantial degradation in phase noise reduction bandwidth. By providing wide phase noise reduction bandwidth, a number of benefits can be achieved, including, but not limited to, filtering of spurs in an input reference clock signal or VCO.

Although an implementation with a unity gain buffer is shown, a buffer can provide other amounts of gain, including, for example, a gain less than 1, a gain equal to 1, or a gain greater than 1. Moreover, although inclusion of a buffer provides wide phase noise reduction bandwidth, phase noise compensation at lower bandwidth can still be provided when the buffer is omitted.

Although the SSPD 300 of FIG. 5A illustrates one embodiment of an SSPD in accordance with the teachings herein, an SSPD can be implemented in a wide variety of ways. Accordingly, other implementations of SSPDs are possible, including, but not limited to, differential implementations. Furthermore, the teachings herein are applicable to other types of sampling circuits as well as to other types of phase detection circuitry suitable for detecting a phase noise of a clock signal.

FIG. 5B is one example of a timing diagram for the SSPD 300 of FIG. 5A. The timing diagram depicts that the input clock signal $CLK_{IN}$ has a DC voltage component $V_{DC}$, and is sampled on rising edges of the reference clock signal $CLK_{REF}$.

In this embodiment, when the input clock signal $CLK_{IN}$ leads the reference clock signal $CLK_{REF}$, the sampled signal S(t) is greater than the DC voltage $V_{DC}$. Additionally, when the input clock signal $CLK_{IN}$ lags the reference clock signal $CLK_{REF}$, the sampled signal S(t) is less than the DC voltage $V_{DC}$. Thus, a difference between the sampled signal S(t) and the DC voltage $V_{DC}$ indicates a timing relationship between the reference clock signal $CLK_{REF}$ and the input clock signal $CLK_{IN}$. In another embodiment, an SSPD is implemented differentially such that the timing relationship is indicated by a difference between a non-inverted component and an inverted component of a differential sampled signal.

FIG. 6A is a schematic diagram of one embodiment of an adjustable delay circuit 350. The adjustable delay circuit 350 includes an up switch 351, a down switch 352, an up current source 353, a down current source 354, a load capacitor 355, and an output inverter 356.

The adjustable delay circuit 350 of FIG. 6A illustrates one example of an adjustable delay circuit that can be included in a clock system to provide phase noise compensation. However, the teachings herein are applicable to adjustable delay circuits implemented in a wide variety of ways. Accordingly, other implementations are possible.

As shown in FIG. 6A, the up switch 351 is controlled by timing of the input clock signal $CLK_{IN}$, and the down switch 352 is controlled by timing of the inverted input clock signal $CLK_{INB}$. The inverted input clock signal $CLK_{INB}$ can be generated in a wide variety of ways, such as using an inverter circuit to invert the input clock signal $CLK_{IN}$, or can be readily available in a differential implementation.

In the illustrated embodiment, when the up switch 351 is closed, the load capacitor 355 is charged by the current $I_\tau$ of the up current source 353. Furthermore, when the down switch 352 is closed, the load capacitor 355 is discharged by the current $I_\tau$ of the down current source 354. The voltage level $V_\tau(t)$ of the load capacitor 355 controls the input of inverter 356. As will be described below with reference to FIG. 6B, a delay in charging or discharging the load capacitor 355 controls an overall delay of the adjustable delay circuit 350.

Although not shown explicitly in FIG. 6A, the current $I_\tau$ of the current sources 353/354 and/or the capacitance $C_\tau$ of load capacitor 355 are controllable by an error signal E(t) input to the adjustable delay circuit 350. Thus, the error signal E(t) controls the delay of the input clock signal $CLK_{IN}$ through the adjustable delay circuit 350.

The delay adjustment can be providing using analog and/or digital control. In one example, an analog error signal tunes the current $I_\tau$ and/or the capacitance C. In another example, a digital error signal controls a number of active elements of the current sources 353/354 and/or load capacitors 355, thereby digitally selecting the current $I_\tau$ and/or the capacitance $C_\tau$.

Although one embodiment of an adjustable delay circuit 350 is shown, the teachings herein are applicable to adjustable delay circuits implemented in a wide variety of ways. Accordingly, other implementations of adjustable delay circuits can be controlled by an error signal to provide phase compensation.

FIG. 6B is one example of a timing diagram for the adjustable delay circuit 350 of FIG. 6A. The timing diagram depicts voltage versus time plots for an input clock signal $CLK_{IN}$, an adjusted clock signal $CLK_{ADJ}$, and a voltage $V_\tau(t)$ across the load capacitor 355.

As shown in FIG. 6B, a delay $\tau$ of the adjustable delay circuit 350 is based on a trip point $V_{TRIP}$ of the inverter 356 and on the slope of the voltage $V_\tau(t)$. Additionally, the voltage $V_\tau(t)$ is based on the current $I_\tau$ and the capacitance C. Accordingly, by controlling the current $I_\tau$ and/or the capacitance $C_\tau$, the delay $\tau$ of the adjustable delay circuit 350 can be controlled.

The adjustable delay circuit 350 of FIG. 6A can be included in the clock systems herein and controlled by an error signal E(t) to control the delay of the input clock signal $CLK_{IN}$ over time to thereby provide phase noise compensation. Although one embodiment of an adjustable delay circuit is shown, the teachings herein are applicable to adjustable delay circuits implemented in a wide variety of ways.

FIGS. 7A-7D are examples of electronic systems that can include a clock system with phase noise compensation in accordance with the teachings herein. Such electronic systems are impacted by the accuracy and/or precision of the clock signal used to control timing, and thus reducing or eliminating phase noise can improve system performance. Moreover, a reduction in phase noise can provide additional benefits, such as enhanced design flexibility and/or lower design cost. Although various examples of electronic systems are described below, clock systems with phase noise compensation can be used in a wide range of electronics.

Figures 7A, 7B:
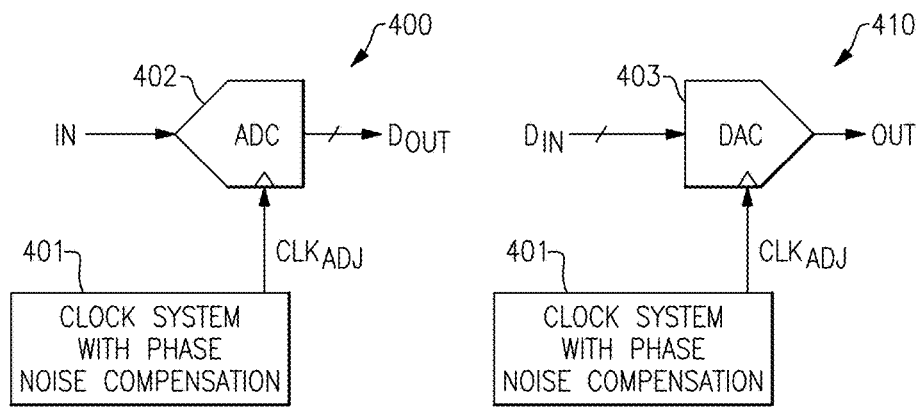
FIG. 7A is a schematic diagram of one embodiment of an analog-to-digital data conversion system.
FIG. 7B is a schematic diagram of one embodiment of a digital-to-analog data conversion system.

FIG. 7A is a schematic diagram of one embodiment of an analog-to-digital data conversion system 400. The analog-to-digital data conversion system 400 includes a clock system 401 that generates a clock signal $CLK_{ADJ}$ with low phase noise. The clock system 401 is implemented in accordance with one or more of the features described herein.

The analog-to-digital data conversion system 400 further includes an ADC 402 that receives an analog input signal IN and generates a digital output signal $D_{OUT}$. The timing of conversion operations of the ADC 402 is controlled by the clock signal $CLK_{ADJ}$. By implementing the analog-to-digital data conversion system 400 with a clock system with low phase noise, superior operation of the ADC 402 can be achieved. For example, timing of data conversion operations can be more tightly controlled, which provides performance enhancement when using a single ADC as well as when using multiple ADCs to digitize signals associated with parallel lanes.

FIG. 7B is a schematic diagram of one embodiment of a digital-to-analog data conversion system 410. The digital-to-analog data conversion system 410 includes a clock system 401 and a DAC 403. The DAC 403 receives a digital input signal $D_{IN}$ and generates an analog output signal OUT. Additionally, the timing of conversion operations of the DAC 403 is controlled by the clock signal $CLK_{ADJ}$. The clock system 401 is implemented in accordance with one or more features herein, and thus the clock signal $CLK_{ADJ}$ has low phase noise to enhance the performance of the DAC 403.

Figure 7C:
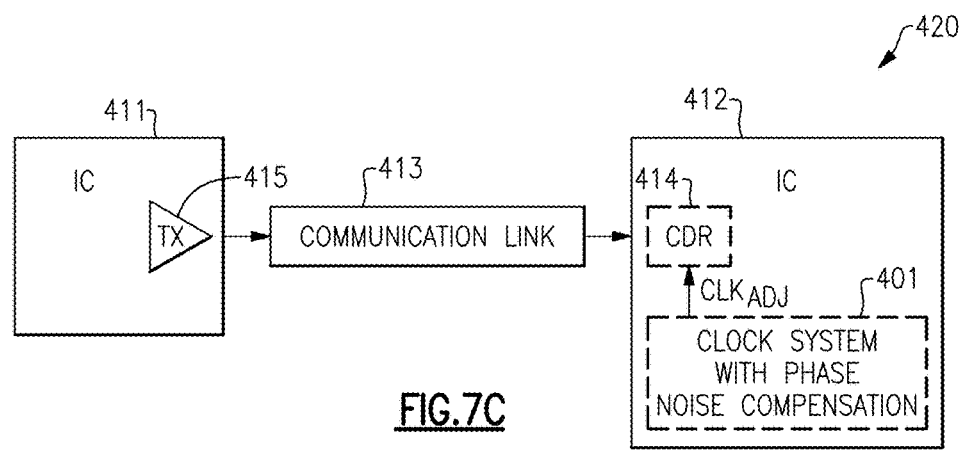
FIG. 7C is a schematic diagram of one embodiment of a serial communication system.

FIG. 7C is a schematic diagram of one embodiment of a serial communication system 420. The serial communication system 420 includes a first semiconductor die or integrated circuit (IC) 411, a second IC 412, and a communication link 413, which can be wired and/or optical. The first IC 411 includes a transmitter 415, and the second IC 412 includes a clock and data recovery (CDR) circuit 414 and a clock system 401 that provides the clock signal $CLK_{ADJ}$ as a reference for CDR operations.

The clock system 401 is implemented in accordance with one or more features herein, and thus the clock signal $CLK_{ADJ}$ has low phase noise to allow data recovery from the communication link 413 at higher rates and/or with lower error.

Figure 7D:
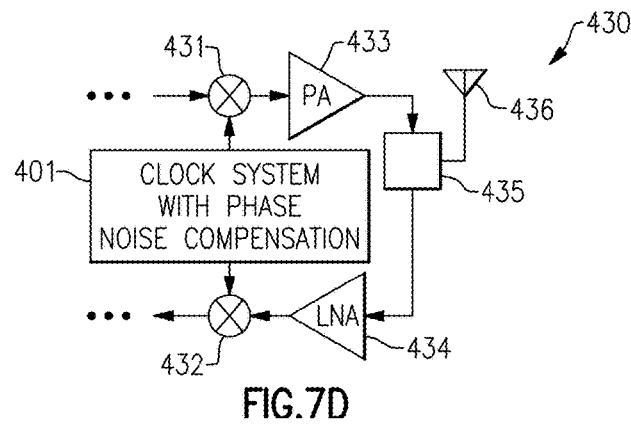
FIG. 7D is a schematic diagram of one embodiment of a radio frequency front-end system.

FIG. 7D is a schematic diagram of one embodiment of a radio frequency front-end system 430. The radio frequency front-end system 430 includes a clock system 401, an upconverting mixer 431, a power amplifier 433, a downconverting mixer 432, a low noise amplifier (LNA) 434, an antenna access component 435 (for instance, a switch, duplexer, or circulator), and an antenna 436.

As shown in FIG. 7D, the clock system 401 serves as a local oscillator for generating clock signals for frequency upconversion and frequency downconversion operations. By implementing the clock system 401 in accordance with the teachings herein, data can be transmitted and/or received with higher spectral purity, which in turn leads to communication at higher bandwidth, at further distances, and/or over noisier radio environments.

Applications

Devices employing the above described schemes can be implemented into various electronic devices. Examples of electronic devices include, but are not limited to, consumer electronic products, parts of the consumer electronic products, electronic test equipment, communication infrastructure, etc. For instance, a clock system with phase noise compensation can be used in a wide range of analog, mixed-signal, and RF systems, including, but not limited to, data converters, chip-to-chip communication systems, clock and data recovery systems, base stations, mobile devices (for instance, smartphones or handsets), laptop computers, tablets, and wearable electronics. A wide range of consumer electronics products can also include a clock system with phase noise compensation for Internet of Things (TOT) applications. For instance, a clock system with phase noise compensation can be included in an automobile, a camcorder, a camera, a digital camera, a portable memory chip, a washer, a dryer, a washer/dryer, a copier, a facsimile machine, a scanner, a multi-functional peripheral device, or a wide range of other consumer electronics products. Furthermore, electronic devices can include unfinished products, including those for industrial, medical and automotive applications.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A clock system with phase noise compensation, the clock system comprising:
a phase locked loop (PLL) configured to generate an input clock signal based on a timing of a reference clock signal;
an adjustable delay circuit configured to receive the input clock signal and to generate an adjusted clock signal by delaying the input clock signal with a delay that is controllable; and a phase noise detector configured to generate an error signal indicating a phase noise of the input clock signal, wherein the phase noise detector and the PLL share a common phase detector circuit; and wherein the phase noise detector is further configured to control the delay of the adjustable delay circuit with the error signal over time to thereby compensate the input clock signal for phase noise.

2. The clock system of claim 1, wherein the phase noise detector is configured to generate the error signal based on comparing the input clock signal to the reference clock signal, wherein the reference clock signal has a controlled timing relationship with respect to the input clock signal.

3. The clock system of claim 2, wherein the common phase detector circuit comprises a sub-sampling phase detector (SSPD) configured to generate a sampled signal by sampling the input clock signal based on the reference clock signal.

4. The clock system of claim 3, wherein the phase noise detector comprises an amplifier configured to generate the error signal based on amplifying the sampled signal.

5. The clock system of claim 4, further comprising a calibration circuit configured to calibrate a gain of the amplifier based on comparing the adjusted clock signal to the reference clock signal.

6. The clock system of claim 1, wherein the common phase detector circuit comprises a sub-sampling phase detector (SSPD), and wherein the SSPD is configured to generate a sampled signal by sampling a feedback clock signal of the PLL based on timing of the reference clock signal, wherein the phase noise detector is configured to generate the error signal based on the sampled signal.

7. The clock system of claim 1, wherein:
the phase detector circuit is configured to generate a sampled signal;
the PLL includes a controllable oscillator configured to control the input clock signal based on the sampled signal; and
the phase noise detector is configured to generate the error signal using the sampled signal.

8. An electronic system with phase noise compensation, the electronic system comprising:
a phase-locked loop (PLL) configured to generate a PLL output clock signal based on timing of a reference clock signal;
an adjustable delay circuit configured to generate an adjusted clock signal by delaying the PLL output clock signal with a delay that is controllable;
a phase noise detector configured to generate an error signal indicating a phase noise of the PLL output clock signal, and to control the delay of the adjustable delay circuit with the error signal to compensate the PLL output clock signal for phase noise; and
a calibration circuit configured to calibrate the phase noise detector based on comparing the adjusted clock signal to the reference clock signal.

9. The electronic system of claim 8, wherein the phase noise detector is configured to generate a sampled signal by sampling the PLL output clock signal based on the reference clock signal, and to generate the error signal based on the sampled signal.

10. The electronic system of claim 9, wherein the phase noise detector comprises an amplifier configured to generate the error signal based on amplifying the sampled signal.

11. The electronic system of claim 9, wherein the phase noise detector comprises a sub-sampling phase detector (SSPD) configured to generate the sampled signal.

12. The electronic system of claim 8, wherein the PLL is configured to generate a sampled signal based on a feedback clock signal of the PLL and the reference clock signal, wherein the phase noise detector is configured to generate the error signal based on the sampled signal.

13. The electronic system of claim 12, wherein the PLL comprises a sub-sampling phase detector (SSPD) in a feedback loop of the PLL and configured to generate the sampled signal.

14. The electronic system of claim 13, wherein the SSPD comprises a sampling capacitor, a hold capacitor, and a buffer between the sampling capacitor and the hold capacitor to inhibit charge sharing of the sampling capacitor and the hold capacitor from limiting a phase noise reduction bandwidth of the PLL.

15. The electronic system of claim 12, wherein the PLL is a sub-sampling phase-locked loop (SSPLL) or an all-digital phase-locked loop (ADPLL).

16. The electronic system of claim 8, further comprising at least one of a mixer, a clock and data recovery (CDR) circuit, an analog-to-digital converter (ADC), or a digital-to-analog converter (DAC) having timing controlled by the adjusted clock signal.

17. The electronic system of claim 8, wherein the PLL and the phase noise detector share a common phase detector circuit.

18. A method of phase noise compensation, the method comprising:
detecting a phase noise of an input clock signal based on samples captured based on a timing of a reference clock signal having a controlled timing relationship with respect to the input clock signal;
generating an error signal based on amplifying the detected phase noise with an amplifier;
generating an adjusted clock signal by delaying the input clock signal using an adjustable delay circuit;
controlling a delay of the adjustable delay circuit with the error signal to thereby compensate the input clock signal for phase noise; and
calibrating a gain of the amplifier based on comparing the adjusted clock signal to the reference clock signal.

19. The method of claim 18, further comprising generating the input clock signal based on the reference clock signal using a phase-locked loop (PLL).

20. The method of claim 19, wherein detecting the phase noise includes using a phase detector circuit, and wherein generating the input clock signal based on the reference clock signal using the PLL includes using the phase detector circuit.

* * * * *